US008505451B2

(12) United States Patent
McLean et al.

(10) Patent No.: US 8,505,451 B2
(45) Date of Patent: Aug. 13, 2013

(54) METHOD OF MAKING A PHOTOPOLYMER SLEEVE BLANK HAVING AN INTEGRAL CUSHION LAYER FOR FLEXOGRAPHIC PRINTING

(75) Inventors: Michael E. McLean, Etowah, NC (US); Dieter Schulze-Baing, Ahaus-Ottenstein (DE); Michael Kockentiedt, Legden (DE); Will Goss, Arden, NC (US)

(73) Assignee: Day International, Inc., Plymouth, MI (US)

( * ) Notice: Subject to any disclaimer, the term of this patent is extended or adjusted under 35 U.S.C. 154(b) by 1219 days.

(21) Appl. No.: 11/124,614

(22) Filed: May 6, 2005

(65) Prior Publication Data

US 2005/0247222 A1 Nov. 10, 2005

Related U.S. Application Data

(60) Provisional application No. 60/568,980, filed on May 7, 2004.

(51) Int. Cl.
*G03F 7/18* (2006.01)

(52) U.S. Cl.
USPC ......................... 101/401.1; 101/376; 428/909

(58) Field of Classification Search
USPC ........................................................ 101/376
See application file for complete search history.

(56) References Cited

U.S. PATENT DOCUMENTS

| | | | | |
|---|---|---|---|---|
| 4,582,777 | A | 4/1986 | Fischer et al. | |
| 5,861,201 | A * | 1/1999 | Blackwelder et al. | 428/36.91 |
| 5,916,403 | A | 6/1999 | Cushner et al. | |
| 6,182,568 | B1 * | 2/2001 | Ogita et al. | 101/376 |
| 6,696,221 | B1 | 2/2004 | McLean et al. | |
| 6,699,548 | B2 | 3/2004 | Van Weperen et al. | |
| 6,703,095 | B2 | 3/2004 | Busshoff et al. | |
| 6,966,259 | B2 | 11/2005 | Kanga et al. | |
| 2002/0069777 | A1 | 6/2002 | Rossini et al. | |
| 2003/0129384 | A1 * | 7/2003 | Kalchbrenner | 428/317.9 |
| 2003/0136285 | A1 * | 7/2003 | Telser et al. | 101/463.1 |
| 2003/0157285 | A1 | 8/2003 | Busshoff et al. | |
| 2003/0188650 | A1 * | 10/2003 | McLean et al. | 101/401.1 |
| 2004/0187719 | A1 * | 9/2004 | Knoll et al. | 101/401.1 |
| 2005/0170287 | A1 | 8/2005 | Kanga | |

FOREIGN PATENT DOCUMENTS

| | | | |
|---|---|---|---|
| EP | 766142 | A1 * | 4/1997 |
| EP | 1 107 063 | A1 | 6/2001 |
| EP | 1 239 329 | A2 | 9/2002 |
| WO | WO 01/49510 | A1 | 7/2001 |

* cited by examiner

*Primary Examiner* — Joshua D Zimmerman
(74) *Attorney, Agent, or Firm* — Dinsmore & Shohl LLP

(57) ABSTRACT

A method of making a photopolymer sleeve blank for use in flexographic printing is provided which includes providing a base sleeve, applying a cushion layer over the base sleeve, applying an optional barrier layer over the cushion layer, and applying a photopolymer layer over the barrier or cushion layer. The method provides a sleeve blank having an integral cushion layer and eliminates the need for a back exposure step.

20 Claims, 2 Drawing Sheets

METHOD OF MAKING A PHOTOPOLYMER SLEEVE BLANK HAVING AN INTEGRAL CUSHION LAYER FOR FLEXOGRAPHIC PRINTING

CROSS REFERENCE TO RELATED APPLICATIONS

This application claims the benefit of U.S. Provisional Application No. 60/568,980, entitled METHOD OF MAKING A PHOTOPOLYMER SLEEVE BLANK HAVING AN INTEGRAL CUSHION LAYER FOR FLEXOGRAPHIC PRINTING, filed May 7, 2004. The entire contents of said application are hereby incorporated by reference.

BACKGROUND OF THE INVENTION

The present invention relates to a method of making a photopolymer sleeve blank, and more particularly, to an improved method of making a photopolymer sleeve for use in flexographic printing applications that may be imaged by an end user.

Flexographic printing plates formed from photopolymerizable compositions are well known for use in printing applications. Such photopolymerizable compositions typically comprise at least an elastomeric binder, a monomer, and a photoinitiator. Upon exposure of the photopolymer plate from the back to actinic radiation, polymerization of the photopolymerizable layer occurs. This step is typically referred to as an initial "back exposure" step in which the polymerized portion of the cross-section of the printing plate is formed, which is referred to as the "floor." The floor provides a foundation for the creation of a relief image on the plate. After the desired image of the printing plate is formed above the floor, the unexposed areas of the plate are removed, typically by washing with a solvent, to form a printing relief. However, when using individually attached plates in which the plates are wrapped around a print cylinder or print sleeve, a seam or void interrupts the image, causing a disruption or distortion in the printed image which is transferred to the substrate.

In more recent years, "seamless" hollow cylindrical sleeves have been developed which include a photopolymer layer as a support for various types of printing. For example, in one existing printing process and product (commercially available from OEC Graphics, Inc. under the designation SEAMEX®), a photopolymerizable material in the form of a flat sheet is wrapped around a metal or plastic sleeve and heated to fuse the ends and bond the photopolymerizable material to the sleeve. The photopolymerizable material is subjected to a back exposure step prior to wrapping the sleeve in order to achieve the required floor to support the details in the relief image. However, it is often desirable to produce a seamless photopolymer surface including an underlying cushion layer such as a cushioning foam. While the above described process can include such a cushion layer, it is very time consuming and limits the production volume.

In order to achieve high volumes of seamless photopolymer sleeves, no "floor" can be present due to the creation of disturbances in the seam during fusing which occurs because the floor and the unexposed photopolymer above the floor fuse under different conditions. Such is not possible with the above-described process because of the need to back expose and polymerize a floor prior to mounting the plate on a sleeve.

It would be desirable to be able to produce high volumes of photopolymer sleeves which include an unexposed photopolymer layer over a cushion layer. It would also be desirable to produce a blank photopolymer sleeve which can be readily provided with images by an end user to improve print quality.

Accordingly, there is still a need in the art for an improved method of making a photopolymer print sleeve for use in flexographic printing operations.

SUMMARY OF THE INVENTION

Embodiments of the present invention meet that need by providing a photopolymer sleeve blank which includes a cushion layer which is integral with the sleeve and which may be formed without the need for back exposing the sleeve. The present invention also provides a photopolymer sleeve blank that can be readily provided with images by an end user to provide flexographic printing plates having improved print quality.

According to one aspect of the present invention, a method of making a seamless photopolymer sleeve blank for use in flexographic printing is provided comprising providing a cylindrical base sleeve including an inner surface and an outer surface; applying a cushion layer over the outer surface of the base sleeve; and applying a photopolymer layer over the cushion layer. The cushion layer takes the place of a conventional "floor," and eliminates the need to back expose the photopolymer layer to form a "floor."

The base sleeve is preferably selected from the group consisting of a fiber-reinforced polymeric resin, metal, or plastic. The base sleeve preferably has a thickness between about 0.01 and about 6.35 mm, and more preferably, between about 0.60 and about 0.80 mm.

The cushion layer is preferably selected from the group consisting of an open cell foam, a closed cell foam, or a volume displaceable material. The cushion layer preferably has a thickness between about 0.25 to about 3.25 mm, and more preferably, between about 1.0 to about 1.50 mm. The cushion layer is preferably applied to the base sleeve by rotary casting, extrusion, blade or knife coating. Alternatively, the cushion layer may be applied to the base sleeve with an adhesive. After applying the cushion layer, the surface of the cushion layer is preferably ground to achieve a predetermined thickness in order to establish the proper relief depth of the final image.

The photopolymer layer preferably comprises a styrenic block copolymer-based material. The photopolymer layer preferably has a thickness between about 1.0 and 1.50 mm. The photopolymer layer is preferably laminated to the surface of the cushion layer by the application of an optional sealer or adhesive promoting agent to the surface of the cushion layer. The photopolymer layer is then preferably fused to the surface of the cushion layer by the application of heat. Preferably, the method includes grinding the surface of the photopolymer layer to achieve a predetermined thickness.

The method also preferably further includes coating the photopolymer layer with an ablatable coating prior to use. The ablatable coating functions to protect the photopolymer layer from UV light, thus preventing curing of the layer prior to use.

In an alternative embodiment of the invention, the method comprises providing a cylindrical base sleeve including an inner surface and an outer surface; applying a cushion layer over the outer surface of the base sleeve; applying a barrier layer over the cushion layer; and applying a photopolymer layer over the barrier layer. The barrier layer preferably comprises a film-forming polymer such as an acrylic resin or polyvinylidene chloride. The barrier layer is preferably applied to the cushion layer by coating, spraying, or brushing. The barrier layer preferably has a thickness between about 0.015 and 0.050 mm, and more preferably, about 0.025 mm. The photopolymer layer is preferably laminated to the barrier layer and then fused by the application of heat.

The resulting sleeve "blank" containing the (uncured) photopolymer layer may be imaged and processed by conventional equipment used in the art. The method preferably further includes forming an image on the photopolymer layer.

Accordingly, it is a feature of embodiments of the present invention to provide a photopolymer sleeve blank for use in flexographic printing applications that includes an integral cushion layer. Other features and advantages of the invention will be apparent from the following description, the accompanying drawings, and the appended claims.

DETAILED DESCRIPTION OF THE PREFERRED EMBODIMENTS

The method of producing a photopolymer sleeve blank provides several advantages over prior art methods in that it utilizes an integral cushion layer having a thickness that allows a later added raised image to have an optional height for printing. Further, the method is less time consuming as it does not require a "back exposure" step, because the cushion layer, and optionally the barrier layer, function as a replacement for the "floor" formed by the back exposure step used in prior art methods. In addition, by providing a blank sleeve with an integral cushion layer for use by an end user, higher print quality can be attained.

Figure 1:
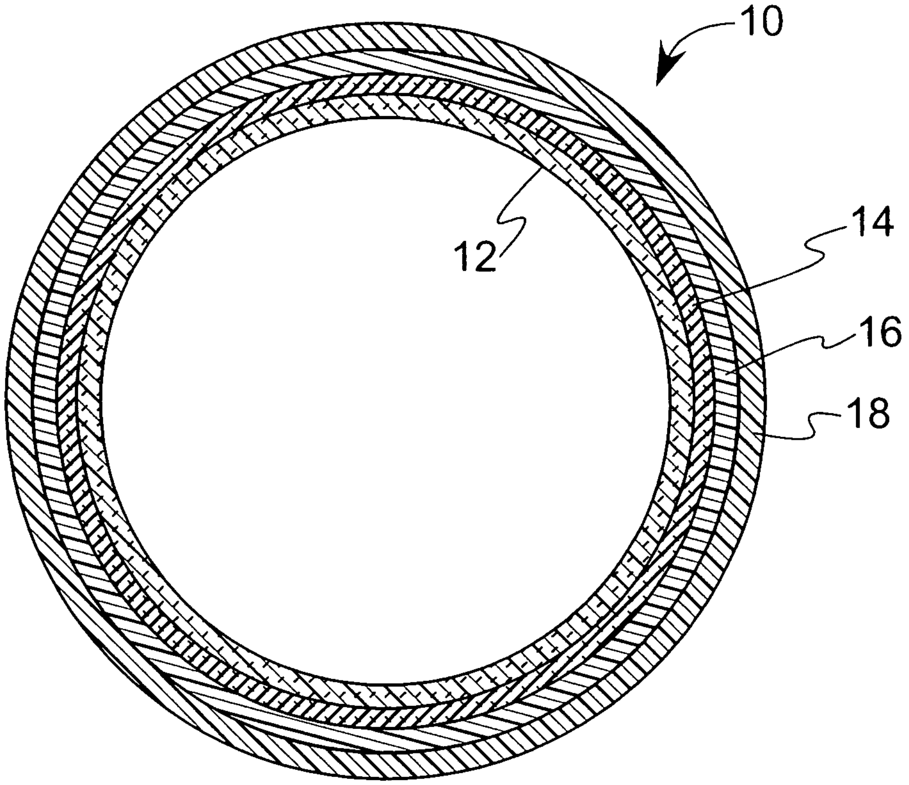
FIG. 1 is a cross-sectional view of a photopolymer sleeve blank according to an embodiment of the present invention.

FIG. 1 illustrates one embodiment of the photopolymer sleeve blank 10 having a seamless surface which comprises a base sleeve 12, a cushion layer 14, an optional barrier layer 16, and a photopolymer layer 18. The base sleeve 12 is a thin-walled hollow cylindrical sleeve which preferably comprises a fiber-reinforced polymer resin having a wall thickness of from between about 0.01 and 6.35 mm, and more preferably, between about 0.60 and 0.80 mm. One example of a base sleeve construction that may be used in the present invention is described in commonly-assigned U.S. Pat. No. 6,703,095. The cylindrical base is expandable under the application of fluid pressure and provides a fluid-tight seal when the sleeve is mounted onto a cylinder, mandrel, or the like.

Cushion layer 14 is applied over base sleeve 12 as shown in FIG. 1. Preferably, cushion layer has a thickness of from between about 0.25 to 3.25 mm, and more preferably, between about 1.0 to 1.50 mm. The cushion layer may take a number of forms, including an open or closed cell foam, or a soft, volume displaceable material having a low Shore hardness of about 30 to 70. One example of a cushion layer which may be used in the method of the present invention is a closed cell foam formed from an elastomeric material containing microcapsules as described in commonly-assigned U.S. Pat. No. 4,770,928, which is incorporated herein by reference.

As shown in FIG. 1, an optional thin barrier layer 16 is preferably applied over cushion layer 14 to form an integral sleeve. The barrier layer preferably comprises a film forming acrylic resin or polyvinylidene chloride and is applied over the cushion layer by knife coating. The barrier layer preferably has a thickness of between about 0.015 mm and 0.050 mm, and more preferably, about 0.025 mm (about 1 mil). The barrier layer is preferably applied to the cushion layer such that any heat generated during the fusing of the photopolymer layer to the underlying layer does not cause any undesirable side effects such as delamination or creation of bubbles in or to the unexposed photopolymer layer. In addition, the thin barrier layer should have sufficient adhesion to the cushion layer and the unexposed photopolymer layer so that the raised image of the final product performs like a raised image on a traditional photopolymer floor formed from a back exposed method.

The photopolymer layer 18 is applied over the barrier layer and preferably comprises a styrenic block copolymer based material such as Dupont Cyrel® HORB or MacDermid SP6.0. The photopolymer layer preferably has a thickness of between about 1.0 and 1.50 mm.

Figure 2:
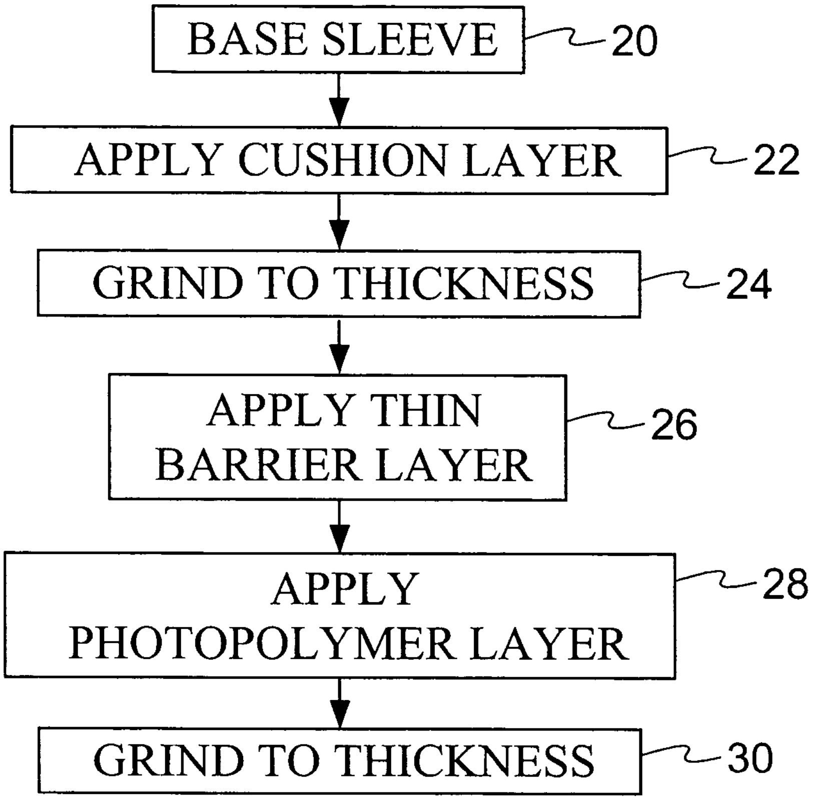
FIG. 2 is a flow chart illustrating the method of making the photopolymer sleeve blank in accordance with an embodiment of the present invention.

The flowchart of FIG. 2 depicts a general representation of the steps used to produce the photopolymer sleeve blank in accordance with one embodiment of the present invention. In step 20, the base sleeve is provided, and in step 22, the cushion layer is applied to the base sleeve. The cushion layer is preferably applied over the base sleeve by rotary casting, extrusion, or blade or knife coating. In step 24, the cushion layer is ground to the desired thickness by methods known in the art such as, for example, stone grinding.

In step 26, the optional thin barrier layer is applied over the cushion layer. The barrier layer is preferably applied by knife coating. An optional adhesive agent may be applied between the layers to insure bonding.

In step 28, the photopolymer layer is applied over the barrier layer. The photopolymer layer is preferably laminated to the barrier layer using a thin sealer and/or adhesive promoting agent. The photopolymer layer is then preferably fused by the application of heat in a manner sufficient to partially melt the photopolymer such that any seams flow together and are substantially eliminated. Preferably, the photopolymer layer is fused by the application of infrared heat. After application, the photopolymer surface is ground to a desired wall thickness (step 30). Preferably, the photopolymer layer is ground by conventional methods such as stone grinding.

After grinding, the sleeve is preferably cleaned and coated with a thin layer of an ablatable coating, such as a LAMS coating. This coating blocks UV light from the photopolymer layer that could polymerize the layer prior to use.

The resulting sleeve comprises a ready-to-image integral sleeve blank that can be imaged and processed in a tubular manner using conventional equipment. The outer surface of the photopolymer layer of the sleeve may be imaged as is known in the art to provide a raised relief surface or depressions for flexographic printing. For example, the photopolymer layer may be imaged by actinic radiation, by mechanical grinding, or by laser ablation to form an imaged relief surface. The resulting sleeve provides high print quality.

Having described the invention in detail and by reference to preferred embodiments thereof, it will be apparent that modifications and variations are possible without departing from the scope of the invention.

The invention claimed is:

1. A method of making a seamless photopolymer sleeve blank for use in flexographic printing comprising:

providing a cylindrical base sleeve including an inner surface and an outer surface;

applying a cushion layer over said outer surface of said base sleeve without back exposing said cushion layer; said cushion layer selected from the group consisting of an open-cell foam, a closed-cell foam, or a soft, volume displaceable material having a Shore hardness of about 30 to 70;

grinding the surface of said cushion layer to a predetermined thickness and to establish a relief depth for a final image to form a floor;

applying a barrier layer over said cushion layer;

applying an adhesive layer over said barrier layer; and applying a photopolymer layer over said adhesive layer and fusing said photopolymer layer by applying heat to partially melt said photopolymer.

2. The method of claim 1 wherein said base sleeve is selected from the group consisting of a fiber-reinforced polymeric resin, metal, or plastic.

3. The method of claim 1 wherein said base sleeve has a thickness between about 0.01 and about 6.35 mm.

4. The method of claim 1 wherein said base sleeve has a thickness between about 0.60 and about 0.80 mm.

5. The method of claim 1 wherein said cushion layer has a thickness between about 0.25 to about 3.25 mm.

6. The method of claim 1 wherein said cushion layer has a thickness between about 1.0 to about 1.50 mm.

7. The method of claim 1 wherein said cushion layer is applied to said base sleeve by rotary casting, extrusion, blade or knife coating.

8. The method of claim 1 wherein said cushion layer is applied to said base sleeve with an adhesive.

9. The method of claim 1 wherein said photopolymer layer comprises a styrenic block copolymer-based material.

10. The method of claim 1 wherein said photopolymer layer has a thickness between about 1.0 and 1.50 mm.

11. The method of claim 1 including grinding the surface of said photopolymer layer to achieve a predetermined thickness.

12. The method of claim 1 including coating said photopolymer layer with an ablatable coating.

13. The method of claim 1 including forming an image on said photopolymer sleeve blank.

14. The method of claim 1 wherein said barrier layer comprises a film-forming polymer.

15. The method of claim 1 wherein said barrier layer comprises an acrylic resin or polyvinylidene chloride.

16. The method of claim 1 wherein said barrier layer is applied to said cushion layer by coating, spraying, or brushing.

17. The method of claim 1 wherein said barrier layer has a thickness between about 0.015 and 0.050 mm.

18. The method of claim 1 wherein said barrier layer has a thickness of about 0.025 mm.

19. A seamless photopolymer sleeve blank formed by the method of claim 1.

20. A method of making a seamless photopolymer sleeve blank for use in flexographic printing comprising:

providing a cylindrical base sleeve including an inner surface and an outer surface;

applying a cushion layer over said outer surface of said base sleeve without back exposing said cushion layer; said cushion layer selected from the group consisting of an open-cell foam, a closed-cell foam, or a soft, volume displaceable material having a Shore hardness of about 30 to 70;

applying a barrier layer over said cushion layer such that said barrier layer is integral with said cushion layer and said layers together function as a floor for a relief image;

applying an adhesive layer over said barrier layer; and applying a photopolymer layer over said adhesive layer.

* * * * *